United States Patent
Wheaton

[19]

[11] Patent Number: 5,880,930
[45] Date of Patent: Mar. 9, 1999

[54] ELECTROMAGNETIC INTERFERENCE SHIELDING ENCLOSURE AND HEAT SINK WITH COMPRESSION COUPLING MECHANISM

[75] Inventor: Chris Wheaton, San Francisco, Calif.

[73] Assignee: Silicon Graphics, Inc., Mountain View, Calif.

[21] Appl. No.: 878,708

[22] Filed: Jun. 18, 1997

[51] Int. Cl.[6] ........................................... H05K 7/20
[52] U.S. Cl. ........................... 361/690; 361/695; 361/704; 361/818; 275/717; 275/718; 275/719; 275/727; 165/80.3
[58] Field of Search ..................................... 361/688, 690, 361/695, 697, 704, 707, 714, 715, 718–720, 816, 818; 165/80.3; 257/717, 718, 719, 727

[56] References Cited

U.S. PATENT DOCUMENTS 5,430,611  7/1995  Patel et al. ............................... 361/705

Primary Examiner—Leo P. Picard
Assistant Examiner—Boris L. Chervinsky
Attorney, Agent, or Firm—Wagner,Murabito&Hao

[57] ABSTRACT

A EMI shield which includes a heat sink and a compression coupling. A top housing formed of electrically conductive material is placed over a circuit board containing electronic devices and is electrically coupled to an electrical ground through contact along the length of a conductive strip which is connected to an electrical ground. A bottom housing formed of electrically conductive material is connected to an electrical ground through electrical contact along the length of a conductive strip located on the bottom of the circuit board so as to form a EMI shielding enclosure. The top housing is formed of thermally conductive material and includes extended surfaces for conducting heat away from the electronic devices contained below the top housing. In addition, the bottom housing is formed of thermally conductive material so as to form a thermally conductive enclosure which acts as a heat sink, effectively cooling the electronic devices contained therewithin. A compression coupling mechanism which uses springs to press the top housing towards the bottom housing gives consistent electrical contact between a microprocessor and a circuit board.

14 Claims, 8 Drawing Sheets

ELECTROMAGNETIC INTERFERENCE SHIELDING ENCLOSURE AND HEAT SINK WITH COMPRESSION COUPLING MECHANISM

TECHNICAL FIELD

The present claimed invention relates to the field of electrical devices. More specifically, the present claimed invention relates to a electromagnetic interference shielding device that includes a heat sink and a connection mechanism for connecting a microprocessor to a circuit board.

BACKGROUND ART

Integrated circuit devices such as microprocessors and memory chips are typically connected to circuit boards by soldering the package that contains the microprocessor or memory chip to a circuit board. However, this type of connection mechanism makes upgrading of integrated circuit devices difficult and expensive.

Recent prior art methods allow for connecting a microprocessor to a circuit board such that the microprocessor may be easily replaced. One of these recent prior art methods includes the use of a microprocessor package which includes a land grid array and an interconnect socket which includes interconnects corresponding to the contacts of the land grid array. The microprocessor fits within the interconnect socket and overlies a grid array formed on a circuit board. A connection system is then used to press the microprocessor and the interconnect socket tightly against the grid array of the circuit board so as to make electrical contact between the microprocessor and the circuit board.

Prior art connection systems for pressing the microprocessor and the interconnect socket against the circuit board include the use of a top plate which overlies the microprocessor. Screws pass through openings in the top plate and pass through corresponding openings in the circuit board so as to engage openings in a backplate. As the screws are tightened, the top plate is pulled towards the backplate and the circuit board so as to press the microprocessor and the interconnect socket against the circuit board. Each screw is typically hand tightened or tightened using a power driven screwdriver. The compression of the assembly is typically controlled by tightening the screw to a specific depth or by torque.

In order to assure an adequate connection, one hundred to two hundred pounds of pressure must be applied to the microprocessor. Over tightening can damage the microprocessor and/or the circuit board. Under tightening causes contact failure or intermittent contact failure. Since hand tightening of the screw or tightening using a power driven screwdriver controls the pressure applied in prior art connection systems, compression is not consistent. This leads to damage to microprocessors and circuit boards, and can cause contact failure or intermittent contact failure.

Another problem with prior art systems is the heat generated by integrated circuit devices of the computer. In particular, there is a need to cool integrated circuit devices such as microprocessors and memory chips. Prior art systems typically include heat sinks for conducting heat away from individual electronic components and integrated circuit devices. These prior art heat sinks are typically formed of a thermally conductive material such as aluminum and they typically include extended surfaces or "fins" for conducting heat away from the device to be cooled.

Prior art computer systems typically use individual heat sinks which are disposed over individual integrated circuit devices for conducting heat away from each integrated circuit device. These prior art heat sinks are typically made of a highly thermally conductive material such as aluminum. Extended surfaces typically extend from the top of each heat sink so as to conduct the heat away from the heat producing integrated circuit device. Cooling fans which attach to the chassis of the computer are often used to circulate air over the extended surfaces so as to conduct heat away from individual heat sinks.

Recent prior art systems have combined a compression coupling mechanism with heat conduction structures by using the top surface of the compression coupling mechanism as a heat sink. In these prior art systems, extended surfaces are typically formed on the top of the compression coupling mechanism. However, such systems are typically compressed by using screws which pass through the top plate, through the circuit board and through a backplate. The backplate engages the threads of the screws so as to hold the screw in place. Each screw is typically hand tightened or tightened using a power driven screwdriver. The compression of the assembly is typically controlled by tightening the screw to a specific depth or by torque. Since hand tightening of the screw or tightening using a power driven screwdriver controls the pressure applied in prior art connection systems, compression is not consistent. Thus, these systems still may damage the integrated surface device and may give incomplete or intermittent contact between integrated circuit devices and circuit boards.

Another problem associated with prior art computer systems is the radio frequency (RF) emissions from integrated circuit devices. These RF emissions cause electromagnetic interference (EMI) which causes interference in other electronic circuits and electronic devices. Typically, an EMI shield is used to reduce RF emissions. This EMI shield typically takes the form of a full size chassis which extends around the entire electronics compartment of the computer. The chassis is typically made of metal. The full size chassis is expensive to manufacture. In addition, in order to effectively shield RF emissions, the chassis must completely enclose the RF producing components. This makes connection to external devices and insertion and removal of removable media such as floppy disks, computer disks, tape storage media and digital video disks difficult. In addition, it is difficult and expensive to manufacture and install on/off buttons, switches and indicator lights which do not violate the EMI shielding requirements. Though the use of a chassis to shield external electronic devices satisfies governmental EMI shielding requirements and prevents interference with external electronic devices, such a system does not shield electronic devices within the computer chassis. Thus, electronic devices and circuits within the computer chassis are subjected to EMI interference.

Manufacture and installation of separate heat sinks, an EMI shielding chassis, and a separate compression coupling mechanism is expensive and time consuming. What is needed is an inexpensive EMI shield which gives good EMI shielding and which minimizes or eliminates electromagnetic interference within the chassis of the computer. In addition, a method and apparatus for achieving uniform and constant connection between a microprocessor and a circuit board is needed. Furthermore, an effective and inexpensive heat sink is needed. Both the heat sink and the EMI shield and the compression coupling mechanism need to allow for the coupling of on/off switches, removable storage media and the replacement of microprocessors and other integrated circuit devices. The present invention provides a solution to the above needs.

DISCLOSURE OF THE INVENTION

The present invention meets the above needs with a EMI shield which functions as a heat sink and which provides consistent compression coupling. The EMI shield of the present invention surrounds the integrated circuit device to be shielded such that RF emissions from the shielded integrated circuit device do not generate interference with other devices located inside or outside the chassis of the computer.

In one embodiment of the present invention, an EMI shield which includes a top housing and a bottom housing is used to shield emissions from a microprocessor which is coupled to a circuit board. The top housing and the bottom housing are formed of a material which is both thermally conductive and electrically conductive such as aluminum. The microprocessor is disposed over an interconnect socket which overlies a grid array located on the circuit board. The top housing is placed over the microprocessor and is electrically coupled to an electrical ground. In one embodiment, the circuit board includes a first contact strip which extends around the grid array on the top of the circuit board. The top housing contacts the grid array so as to form electrical contact along the length of the contact strip. Similarly, the bottom housing contacts a contact strip which extends around the bottom surface of the circuit board so as to form electrical contact along the length of the second contact strip. The first contact strip and the second contact strip are connected to an electrical ground such that the top housing and the bottom housing form an enclosure around the microprocessor which is connected to electrical ground. This enclosure absorbs RF radiation emitted by the microprocessor.

In one embodiment, the top housing includes extended surfaces which project from the body of the top housing. The top housing is thermally coupled to the microprocessor such that heat generated by the microprocessor is conducted into the top housing and into the extended surfaces of the top housing where the heat is dissipated.

The top housing is coupled to the bottom housing by a compression coupling mechanism which includes posts which extend from the bottom housing. The posts extend through openings in the circuit board and openings in the top housing. Springs are placed over each of the posts such that the springs contact the top housing. Screws which include screw heads having a diameter greater than the diameter of the springs are fully screwed into the posts. The posts extend a constant distance above the top of the top housing so as to provide uniform and measured compression of each spring. A uniform and constant force is therefore applied between the microprocessor and the circuit board. Thus, damage to the microprocessor and/or to the circuit board is prevented. In addition, since uniform compression is applied between the circuit board and the microprocessor, problems such as incomplete contact and intermittent contact are avoided.

Though the present invention is described with reference to connecting, shielding, and conducting heat away from a microprocessor, any electrical device which emits heat and RF radiation could be connected, shielded and cooled. In addition, devices which are connected to the circuit board using other connection mechanisms could be shielded and cooled. In one embodiment, memory chips are connected to both the top and the bottom of the circuit board by conventional soldering techniques. The memory chips are disposed within the enclosure formed between the top housing and the bottom housing such that RF emissions are shielded. The memory chips which are connected to the top surface of the circuit board are thermally coupled to the top housing such that the heat which they generate is conducted into the extended surfaces and dissipated. The memory chips which are connected to the bottom surface of the circuit board are thermally coupled to the bottom housing such that the heat which they generate is conducted into the bottom housing and dissipated.

By combining the functions of a heat sink and an EMI shield and a compression coupling mechanism into a single device, significant cost savings are realized since there is no need to manufacture three separate components. In addition, placing the EMI shield over the RF emitting device shields other internal devices from EMI interference. Thus, an extensive EMI shielding chassis is not required for shielding RF radiation emanating from the RF emitting device. In addition, the compression coupling mechanism of the present invention gives more uniform coupling of the microprocessor to the circuit board than that of prior art systems. In addition, by providing an EMI shield directly over devices emitting RF radiation, significant cost savings in the design and manufacture of components that provide on/off functions and indicator functions is obtained. In addition, cost savings in incorporating removable storage media systems are obtained.

BRIEF DESCRIPTION OF THE DRAWINGS

The accompanying drawings, which are incorporated in and form a part of this specification, illustrate embodiments of the invention and, together with the description, serve to explain the principles of the invention.

BEST MODE FOR CARRYING OUT THE INVENTION

Reference will now be made in detail to the preferred embodiments of the invention, examples of which are illustrated in the accompanying drawings. While the invention will be described in conjunction with the preferred embodiments, it will be understood that they are not intended to limit the invention to these embodiments. On the contrary, the invention is intended to cover alternatives, modifications and equivalents, which may be included within the spirit and scope of the invention as defined by the appended claims. Furthermore, in the following detailed description of the present invention, numerous specific details are set forth in order to provide a thorough understanding of the present invention. However, it will be obvious to one of ordinary skill in the art that the present invention may be practiced without these specific details. In other instances, well known methods, procedures, components, and circuits have not been described in detail as not to unnecessarily obscure aspects of the present invention.

Figure 1:
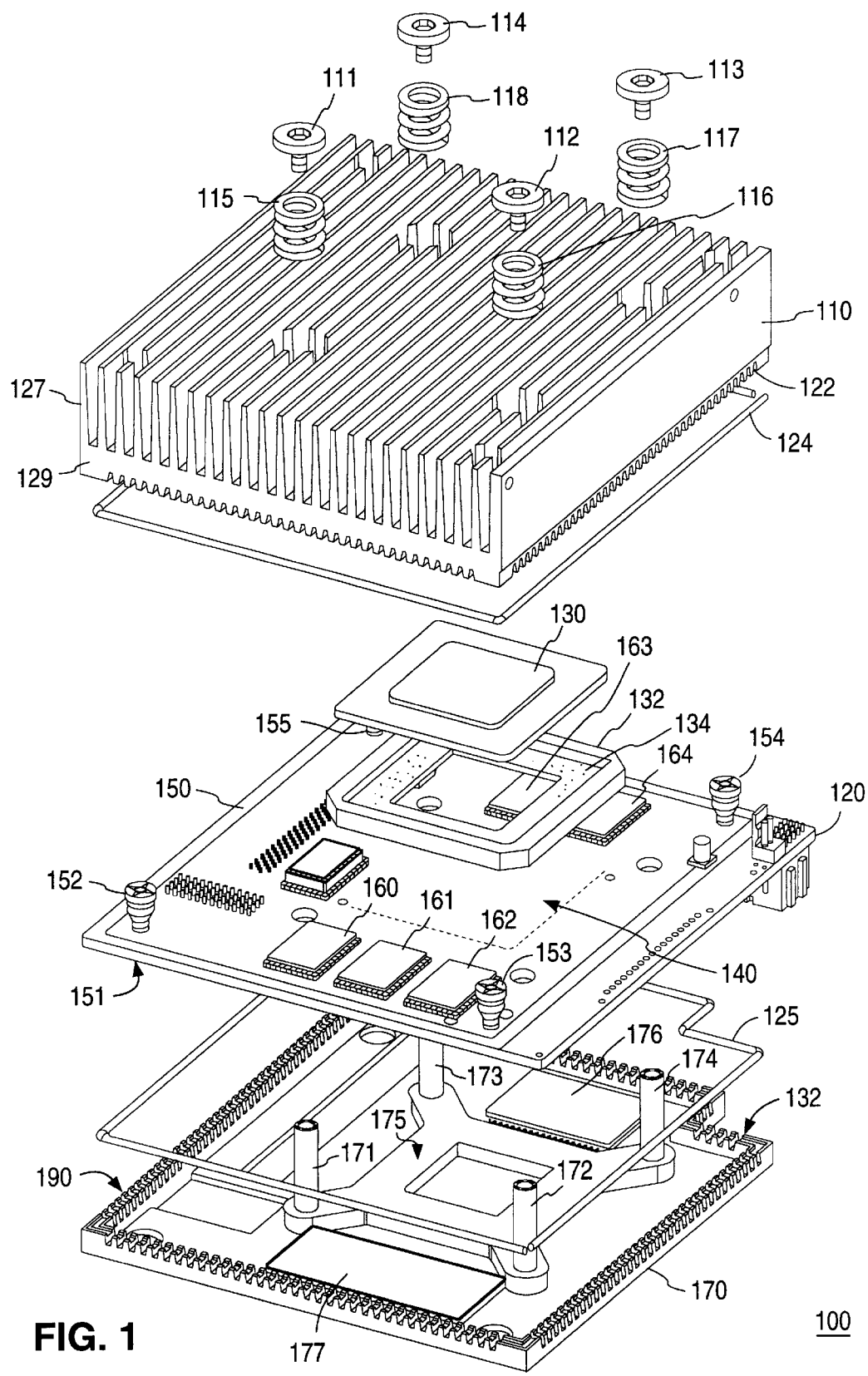
FIG. 1 is a exploded perspective view illustrating EMI shield in accordance with the present invention.

FIG. 1 shows EMI shield 100 to include circuit board 120 which is disposed between top housing 110 and bottom housing 170. Microprocessor 130 fits within interconnect socket 132 which overlies land grid array contact area 140 of circuit board 120 such that contact pads of microprocessor 130 make contact with corresponding contact pads formed within land grid array contact area 140 through electrically conductive members, shown generally as interconnects 134.

Also connected to circuit board 120 of FIG. 1 are cache memory chips 160–164 which are attached to the top surface of circuit board 120. Conductive strip 150 extends around the top surface of circuit board 120 so as to surround cache memory chips 160–164 and land grid array contact area 140. Memory chips 165–169 (not shown) are attached to the bottom surface of circuit board 120. Conductive strip 151 is formed within the bottom surface of circuit board 120 such that it peripherally surrounds memory chips 165–169.

Figure 2:
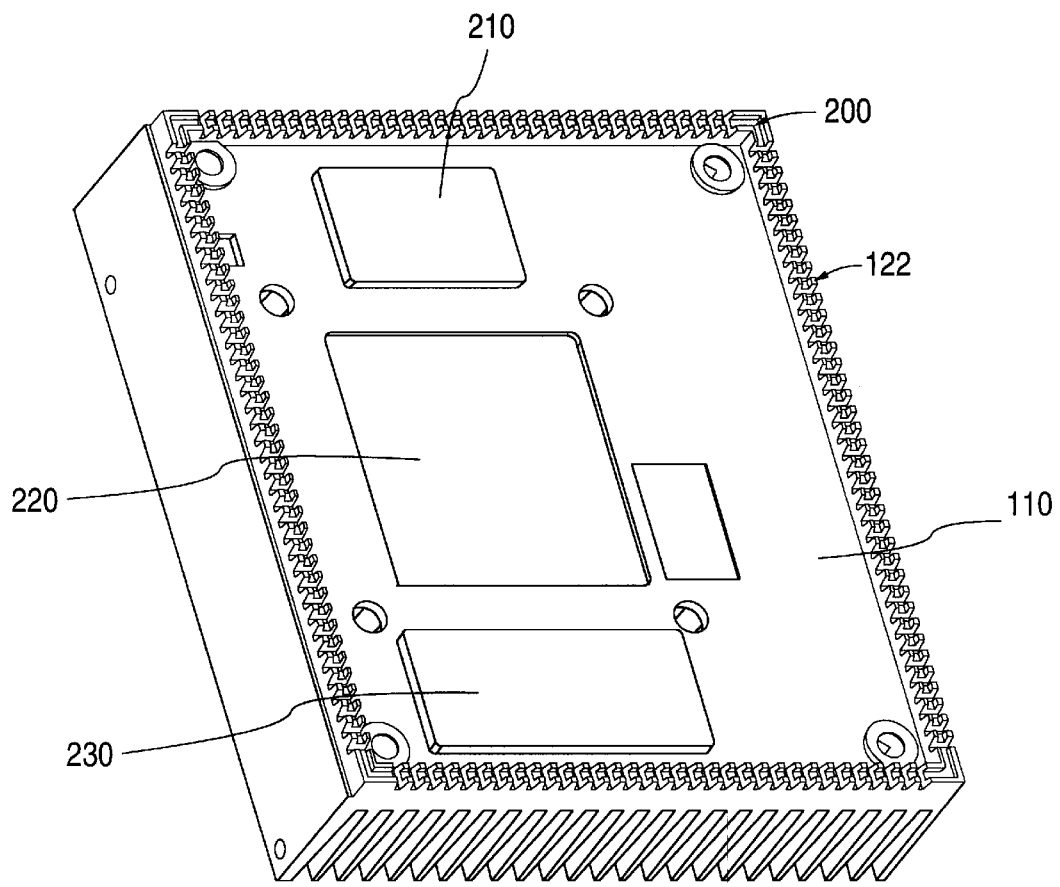
FIG. 2 is a bottom view of a top housing in accordance with the present invention.

Top housing 110 includes contact surface 220 of FIG. 2 which fits over microprocessor 130 of FIG. 1 so as to apply a uniform force across the top surface of microprocessor 130. Contact surface 210 of FIG. 2 and contact surface 230 overlie memory chips 160–164 and are raised so as to accommodate the height of memory chips 160–164. Similarly, bottom housing 170 includes contact surfaces 176–177 which are raised so as to accommodate the height of memory chips 165–169. Supporting surface 175 supports circuit board 120.

With reference again to FIG. 1, screws 152–155 extend through openings in circuit board 120 and openings in bottom housing 170 for coupling electromagnetic shield 100 to the main logic board of the computer (not shown). Posts 171–174 extend from the top of bottom housing 170 and engage openings in circuit board 120 and openings in top housing 110. Springs 115–118 fit over posts 171–174 and are compressed by screws 111–114 so as to securely couple top housing 110 to bottom housing 170. Screws 111–114 have heads which have a diameter greater than the diameter of springs 115–118 such that, when screws 111–114 are fully screwed into posts 171–174, springs 115–118 are compressed. The length of posts 171–174 is uniform such that springs 115–118 are compressed a constant distance. This applies a constant force between top housing 110 and bottom housing 170.

Groove 200 of FIG. 2 extends through teeth 122 and is adapted to receive gasket 124 of FIG. 1. Upon mating top housing 110 with circuit board 120 of FIG. 1, gasket 124 and teeth 122 are disposed over conductive strip 150. In one embodiment, gasket 124 is a electrically conductive gasket which, in conjunction with teeth 122, provides an electrical connection along the full length of conductive strip 150. Similarly, teeth 132 have groove 190 extending therethrough which is adapted to receive gasket 125. Upon mating bottom housing 170 with circuit board 120, gasket 125 fits in groove 190 such that gasket 125 and teeth 132 contact conductive strip 151. In one embodiment, gasket 125 of FIG. 1 is a electrically conductive gasket which, in conjunction with teeth 132, provides an electrical connection along the full length of conductive strip 151.

In one embodiment, electrically conductive gaskets 124–125 comprise rubber tubes coated with silver, manufactured by Vanguard Products of Danbury Conn. By using conductive gaskets 124–125 in conjunction with teeth 122 and teeth 132, an effective EMI shield is obtained since there are no gaps which violate the EMI shield. In addition, the use of conductive gaskets 124–125 in conjunction with teeth 122 and teeth 132 produces a structure which is easy to reopen and reseal numerous times. In one embodiment, the individual teeth of teeth 122 and teeth 132 are separated by a distance of approximately 0.10 inch so as to effectively shield computer chips in the range of 100 to 300 megahertz.

Alternately, top housing 110 and bottom housing 170 could be directly connected to circuit board 120 without using conductive gaskets 124–125. However, such a structure can produce gaps between top housing 110 and circuit board 120 and between bottom housing 170 and circuit board 120 which could allow RF radiation to escape.

Figure 3:
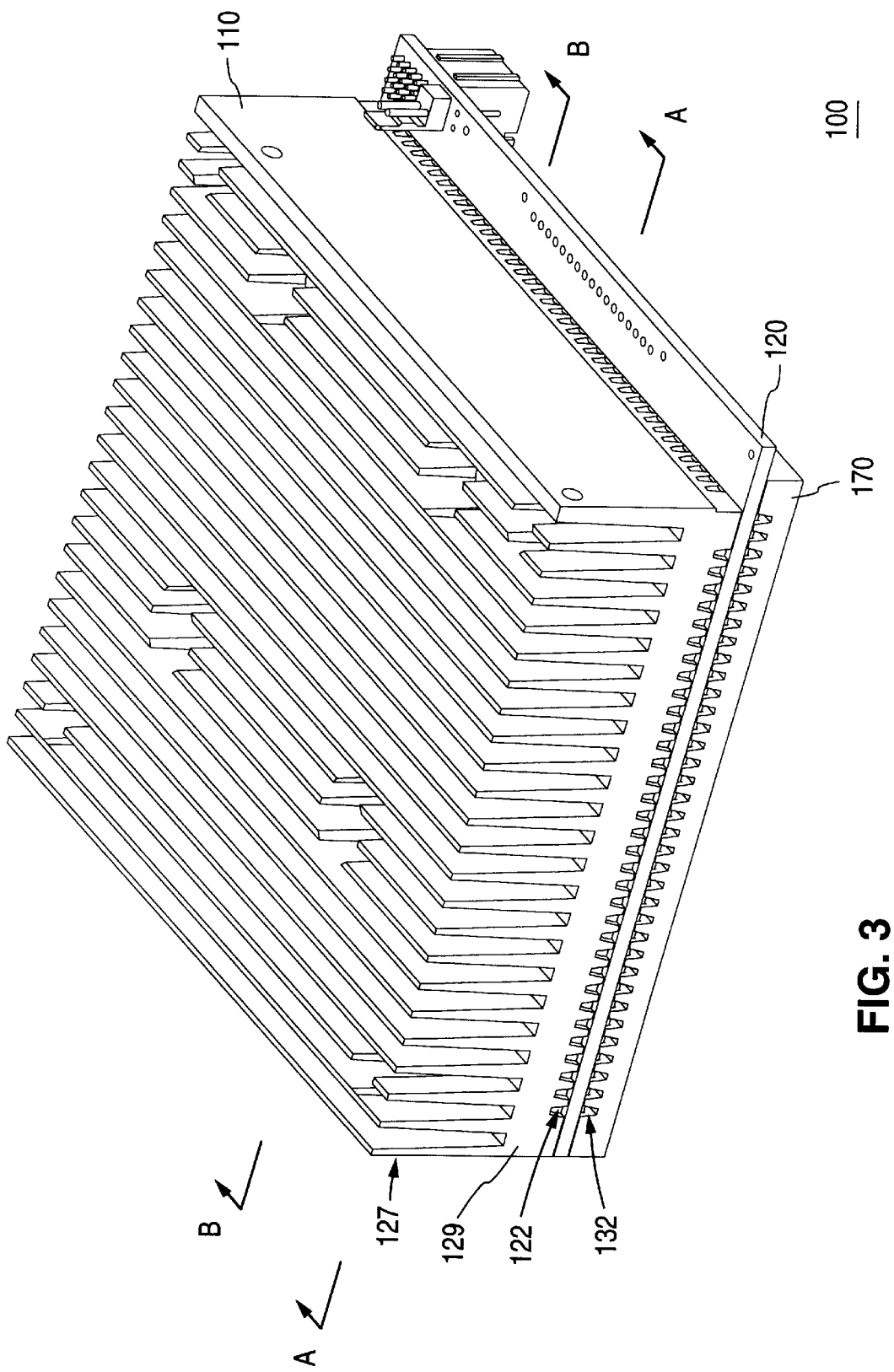
FIG. 3 is a perspective view illustrating an EMI shield in accordance with the present invention.

FIG. 3 shows EMI shield 100 to include top housing 110 and bottom housing 170 which extend around portions of circuit board 120 such that the electronic components of circuit board 120 which generate electromagnetic interference, such as microprocessor 130 and memory chips 160–169 of FIG. 1, are contained therebetween. Top housing 110 and bottom housing 170 are formed of electrically and thermally conductive material. In one embodiment, top housing 110 and bottom housing 170 are formed of aluminum. Top housing 110 and bottom housing 170 are connected to an electrical ground through conductive strip 150 and conductive strip 151 such that electromagnetic radiation is absorbed by top housing 110 and bottom housing 170. Thus, top housing 110 and bottom housing 170 form a structure around microprocessor 130 and memory chips 160–169 which functions as an EMI shield.

Continuing with FIG. 3, top housing 110 of EMI shield 100 includes housing body 129 from which extended surfaces, shown generally as 127 extend. Extended surfaces 127 are narrow raised surfaces so as to increase the surface area of housing top 110. This allows for more efficient dissipation of heat from housing top 110. Since both top housing 110 and bottom housing 170 are made of thermally conductive material, EMI shield 100 forms a thermally conductive enclosure which extends around portions of circuit board 120. This thermally conductive enclosure forms a heat sink which conducts heat away from the electronic components of circuit board 120 contained within the enclosure. Since microprocessor 130 and memory chips 160–169 of FIG. 1 are located within the thermally conductive enclosure formed by top housing 110 and bottom housing 170, the heat which they generate is conducted away from the electronic components and dissipated. In one embodiment, top housing 110 directly contacts microprocessor 130 and memory chips 160–164 and bottom housing 170 directly contact memory chips 165–169 so as to conduct heat therefrom.

Figure 4:
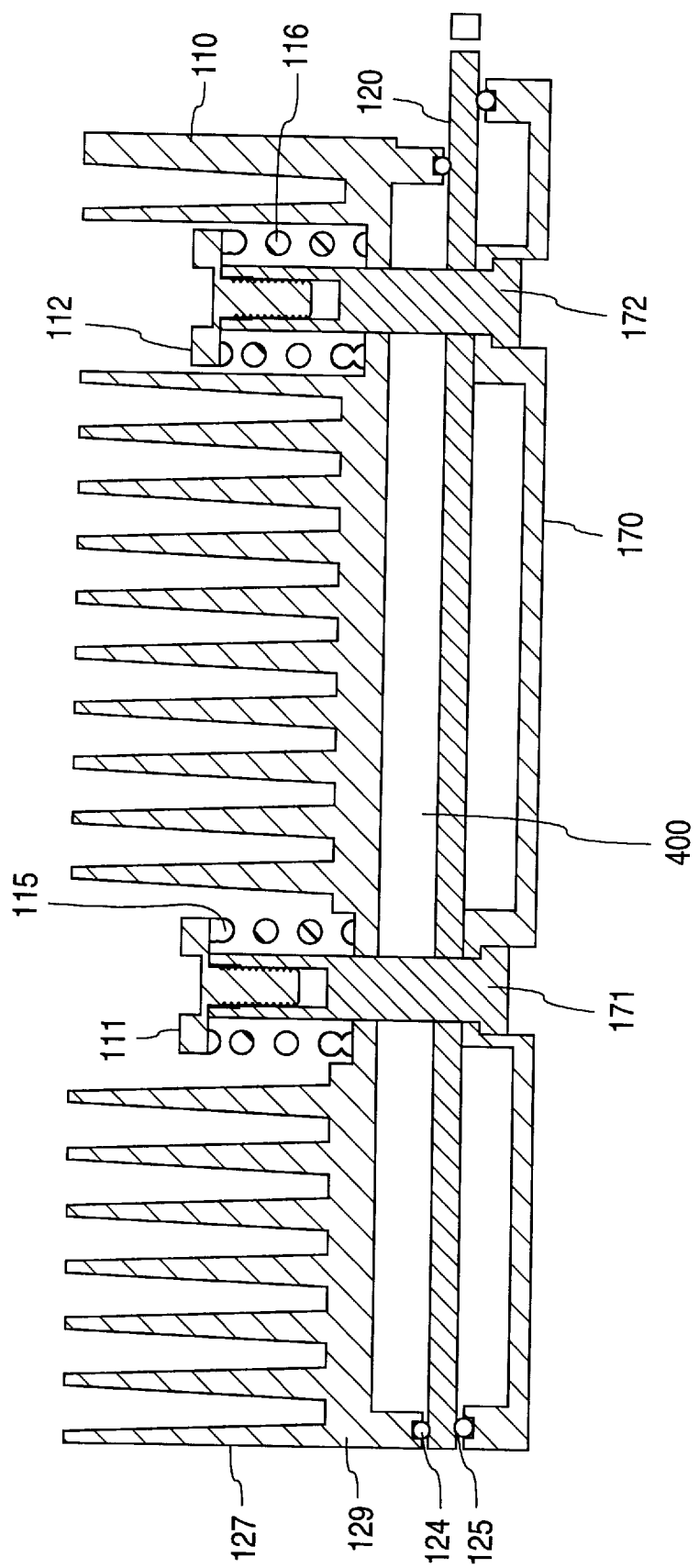
FIG. 4 is a side cross sectional view along axis A—A of FIG. 3 illustrating an EMI shield in accordance with the present invention.

FIG. 4 shows screw 111 to engage post 171 so as to compress spring 115 such that spring 115 exerts a force pressing top housing 110 and bottom housing 170 together. Similarly, screw 112 is shown to engage post 172 so as to compress spring 116 such that spring 116 exerts a force pressing top housing 110 and bottom housing 170 together. Top housing 110 and bottom housing 170 are shaped so as to form enclosure 400 therebetween which covers portions of circuit board 120.

Figure 5:
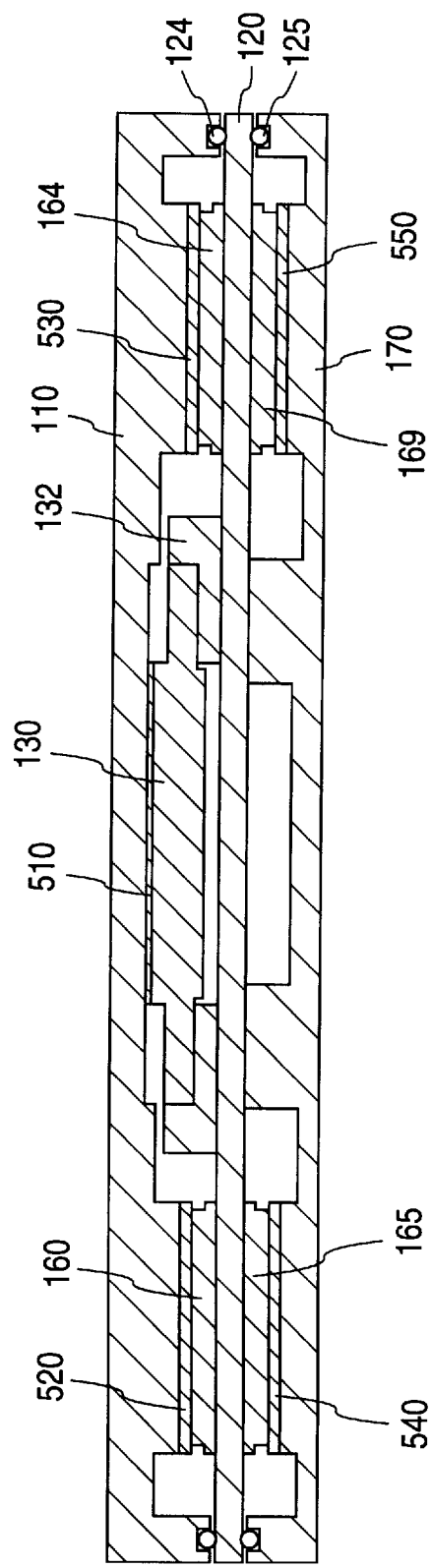
FIG. 5 is a side cross sectional view along axis B—B of FIG. 3 illustrating an EMI shield in accordance with the present invention.

In the embodiment shown in FIG. 5, thermally conductive dielectric layers are disposed between integrated circuit devices such as microprocessor 130 and memory chips 160–169 (161–163, 166–168 are not shown), and top housing 110 and bottom housing 170. These thermally conductive dielectric layers include pad 510 which overlies microprocessor 130. Pad 520 overlies memory chips 160–162 and pad 530 overlies the top surface of memory chips 163–164 so as to provide good thermal contact between memory chips 160–164 and top housing 110. Similarly, pad 540 underlies memory chips 165–167 and pad 550 underlies memory chips 168–169 so as to provide good thermal contact between memory chips 165–169 and bottom housing 170.

With reference again to FIG. 5, pad 510 is made of dielectric material so as to prevent electrical contact that could result in a short between microprocessor 130 and top housing 110. Similarly, pads 520, 530, 540, and 550 are made of dielectric material to prevent possible electrical shorts. In one embodiment, pads 510, 520, 530, 540, and 550 are made of ceramic powder disposed in a flexible polyethylene matrix made by Thermagon, Inc. of Cleveland Ohio. A layer of dielectric material such as Kapton film (not shown) may be disposed between the electrically conductive surfaces of circuit board 120 and bottom housing 170 to prevent unintended electrical contact between the circuits of circuit board 120 and bottom housing 170.

Figure 6:
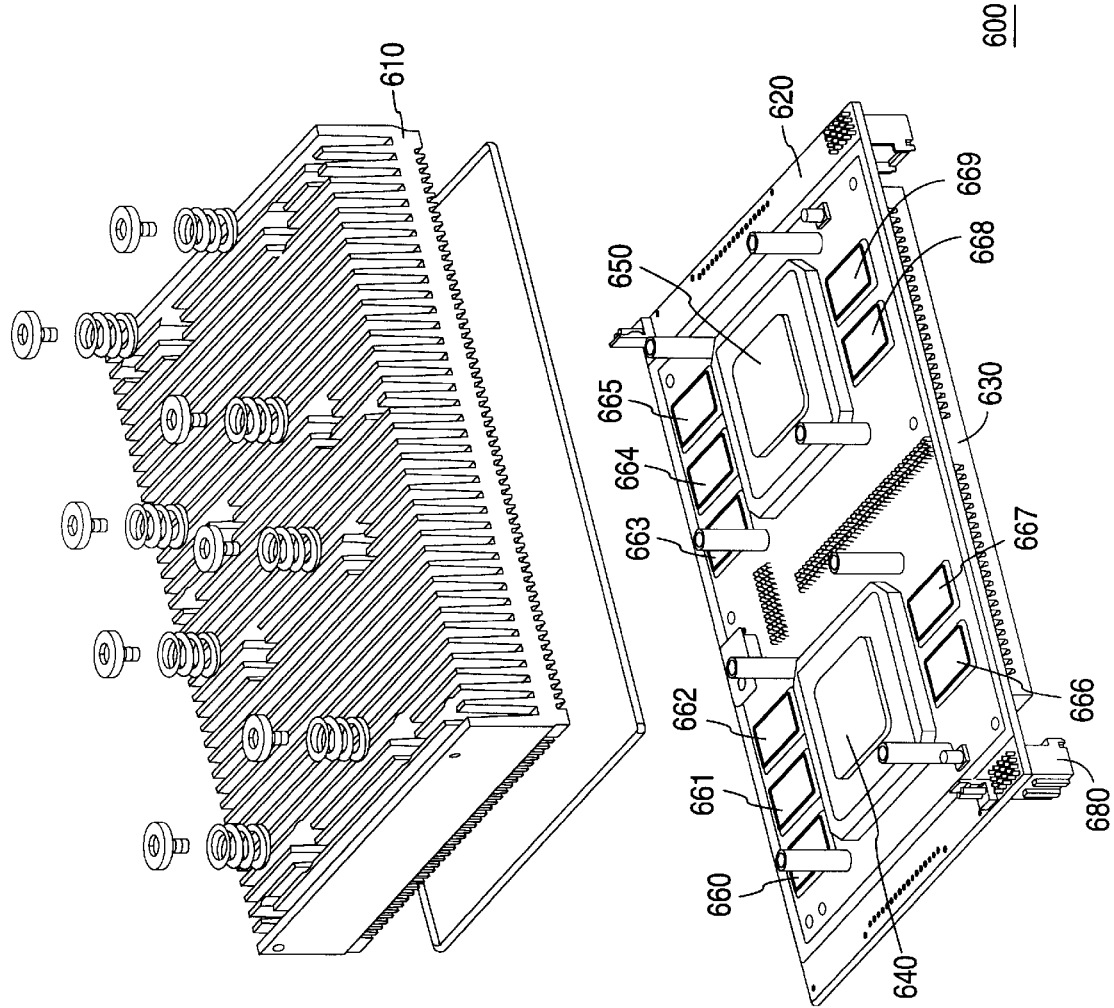
FIG. 6 is a partially exploded perspective view of an EMI shield disposed around two microprocessors in accordance with the present invention.

Various combinations of integrated circuit devices may be contained within the EMI enclosure. FIG. 6 shows an embodiment in which two microprocessors are contained within the enclosure formed between top housing 610 and bottom housing 630 of EMI shield 600. In this embodiment, circuit board 620 includes microprocessor 640 and microprocessor 650 and cache memory chips 660–669. Contact to power supply and other devices and systems is made by connection to circuit board 620 using connection devices such as, for example, connector 680.

Figure 7:
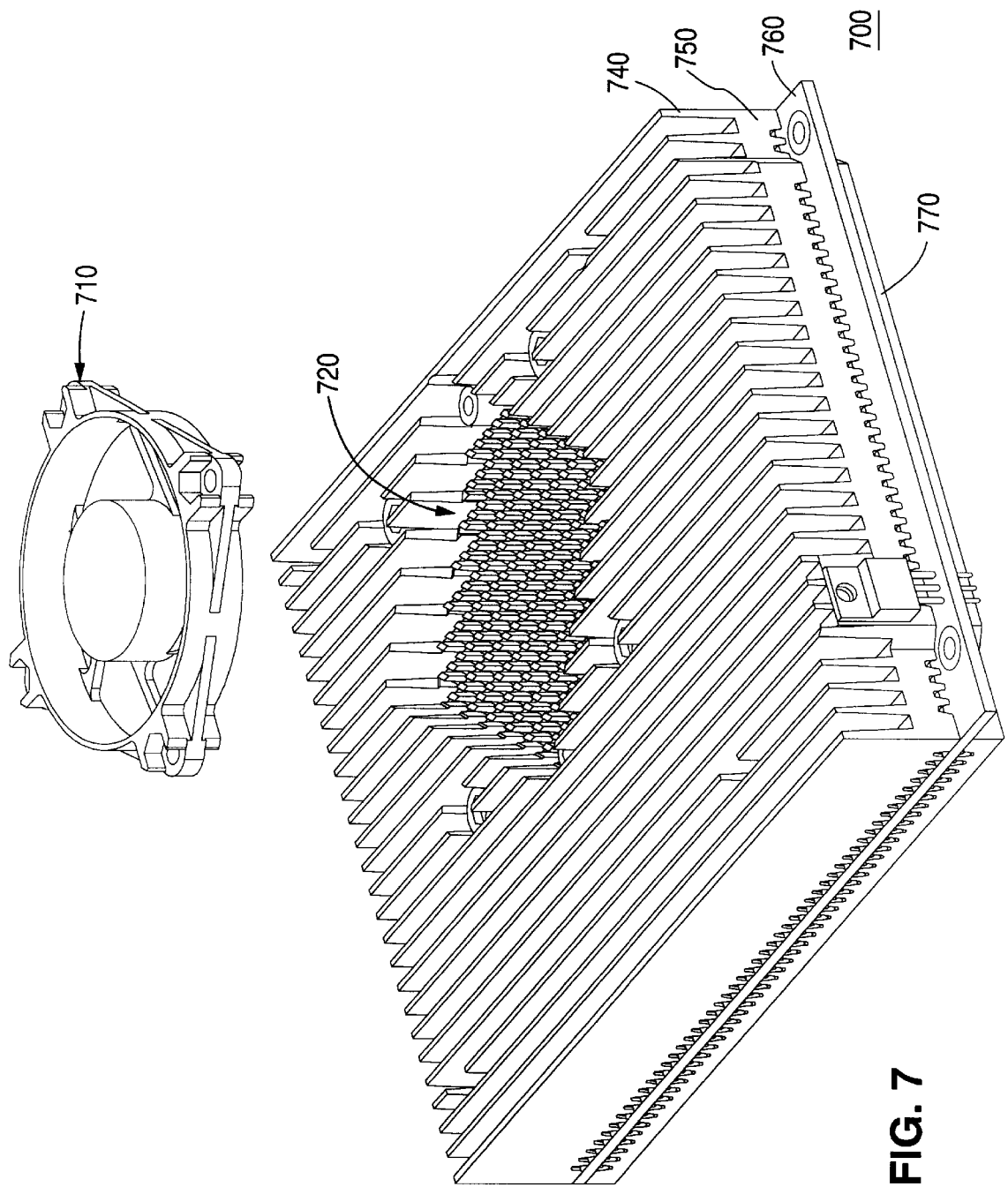
FIG. 7 is a partially exploded perspective view of an EMI shield including an impingement fan in accordance with the present invention.

FIG. 7 shows an embodiment which includes impingement fan 710. Impingement fan 710 fits within impingement region 720 and circulates air onto top housing 750. In one embodiment, impingement fan 710 is a 12 volt axial flow fan made by Shico, of Tokyo, Japan which plugs into circuit board 760. Extended surfaces 740 within impingement region 720 are shorter than extended surfaces 740 which do not lie within impingement region 720 so as to accommodate impingement fan 710. In addition, extended surfaces 740 within impingement region 720 are cut diagonally so as to increase the surface area of extended surfaces 740 within impingement region 720. The circulation of air onto top housing 750 conducts heat from extended surfaces 740 so as to cool electronic components within EMI shield 700. The use of impingement fan 710 increases the heat transfer rate and provides more effective cooling of the electronics contained between top housing 750 and bottom housing 770.

Figure 8:
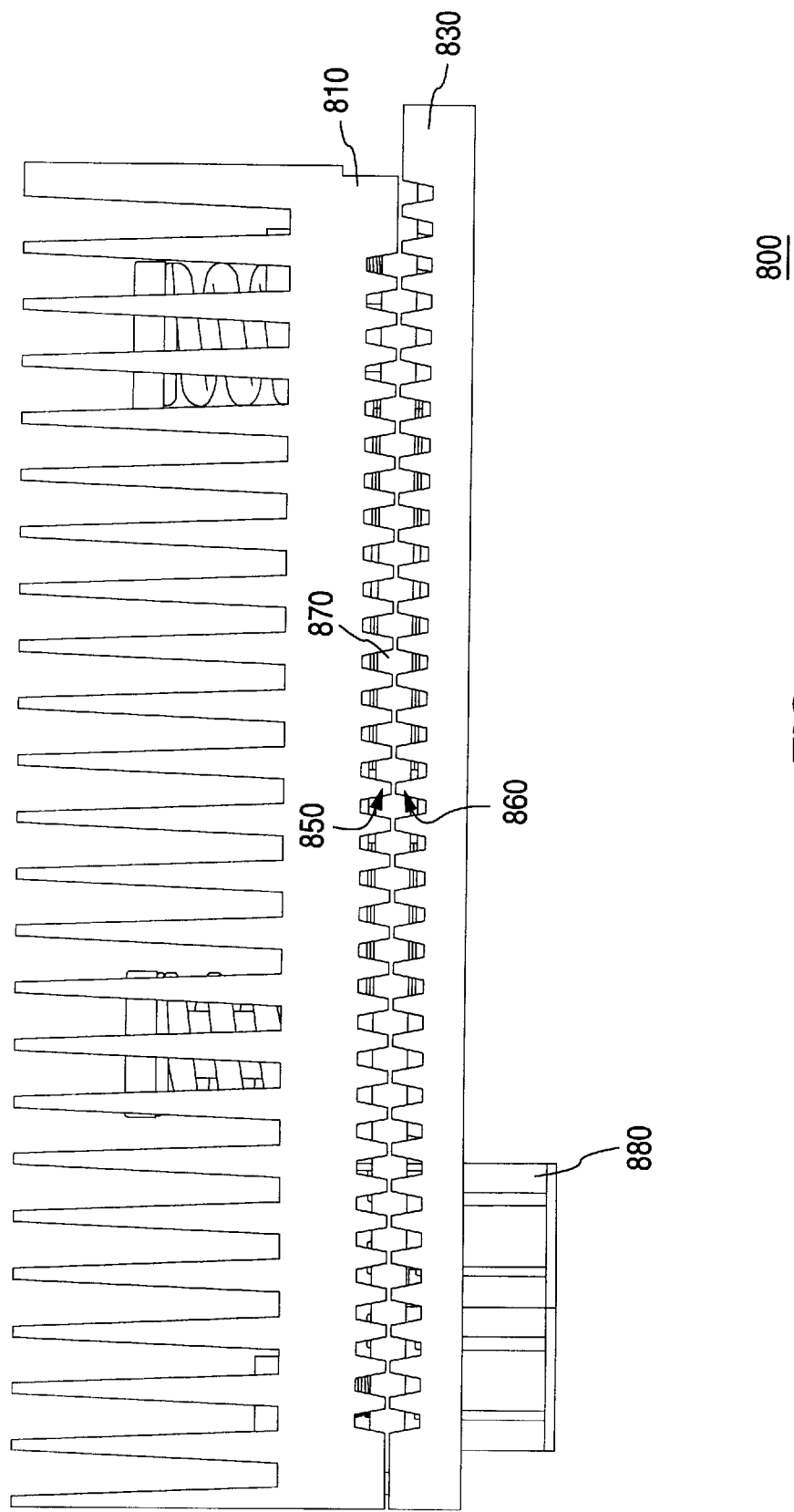
FIG. 8 is a side view of an EMI shield in accordance with the present invention.

In an alternate embodiment, EMI shield 800 of FIG. 8 includes top housing 810 and bottom housing 830 which are connected together so as to provide an EMI shield. Circuit board 820 is smaller than the circuit boards shown in FIGS. 1–7 such that it fits entirely within the EMI enclosure formed by top housing 810 and bottom housing 830. In one embodiment, teeth, shown generally as teeth 850 extend from top housing 810 and teeth, shown generally as teeth 860 extend from bottom housing 830. Teeth 850 and teeth 860, in conjunction with conductive seal 870 provide an electrical connection between top housing 810 and bottom housing 830. In this embodiment, circuit board 820 is sandwiched between top housing 810 and bottom housing 830 such that electrical contact is made to both top housing 810 and bottom housing 830. Connectors 880 allows for contact to a power supply source and to external devices and systems.

The embodiments shown in FIGS. 1–8 allow for the efficient shielding of RF emissions and allow for conduction of heat away from electronic components located within the EMI shield. The EMI shield of the present invention eliminates the need for an extensive EMI shielding enclosure such as the expensive EMI shielding chassis required in prior art systems. In addition, The EMI shield of the present invention is less expensive than prior art systems since there is no need for a separate heat sink structure. In addition, consistent and uniform contact is maintained between the microprocessor and the circuit board without the need for a separate connection structure as is required in many prior art systems.

The foregoing descriptions of specific embodiments of the present invention have been presented for purposes of illustration and description. They are not intended to be exhaustive or to limit the invention to the precise forms disclosed, and obviously many modifications and variations are possible in light of the above teaching. The embodiments were chosen and described in order to best explain the principles of the invention and its practical application, to thereby enable others skilled in the art to best utilize the invention and various embodiments with various modifications as are suited to the particular use contemplated. It is intended that the scope of the invention be defined by the claims appended hereto and their equivalents.

I claim:

1. An electromagnetic interference shield with thermal conduction comprising:

a first housing formed of electrically conductive material, said first housing connected to an electrical ground;

a second housing disposed over said first housing so as to form an enclosure therebetween, said second housing formed of thermally conductive and electrically conductive material and connected to an electrical ground, said second housing having a heat conduction and dissipation system thermally coupled thereto; and an integrated circuit device disposed within said enclosure and thermally coupled to said second housing such that heat generated by said integrated circuit device is conducted away from said integrated circuit device and is dissipated through said heat conduction and dissipation system, said second housing and said first housing absorbing emissions from said integrated circuit device so as to form an electromagnetic interference shield around said integrated circuit device;

a circuit board electrically coupled to an external power supply and electrically coupled to external devices, said circuit board disposed within said enclosure and electrically coupled to said integrated circuit device such that power may be applied to said integrated circuit device through said circuit board and such that electrical signals may be coupled between said external devices and said integrated circuit device;

an interconnect socket disposed between said integrated circuit device and said circuit board, said interconnect socket including a plurality of interconnects for electrically coupling said integrated circuit device to said circuit board; and a compression coupling mechanism for attaching said second housing to said first housing such that pressure is applied between said second housing and said first housing so as to press said integrated circuit device and said interconnect socket against said circuit board so as to electrically couple said integrated circuit device to said circuit board;

a plurality of posts extending from said first housing, said plurality of posts extending through openings in said circuit board and openings in said second housing;

a plurality of springs disposed over said posts such that said springs contact said second housing; and a plurality of screws disposed within said posts, said screws having heads which contact said springs such that, upon the full engagement of said screws within said posts, said screws compress said springs such that said springs exert a relatively constant force between said second housing and said first housing so as to press said integrated circuit device and said compression coupling against said circuit board and wherein circuit board has a top surface and a bottom surface, said top surface including a first conductive grounding strip, said bottom surface having a second conductive grounding strip, said circuit board disposed between said second housing and said first housing such that said second housing contacts said first conductive grounding strip and said first housing contacts said second conductive grounding strip so as to electrically ground said second housing and said first housing.

2. The electromagnetic interference shield of claim 1 wherein said second housing and said first housing comprise aluminum.

3. The electromagnetic interference shield of claim 1 wherein said second housing has a bottom surface which includes a first set of teeth extending therefrom such that said first set of teeth contact said first conductive grounding strip so as to electrically connect said second housing to said circuit board and wherein said first housing has a top surface which includes a second set of teeth extending therefrom such that said second set of teeth contact said second conductive grounding strip so as to electrically connect said first housing to said circuit board.

4. The electromagnetic interference shield of claim 3 wherein said first set of teeth have a groove disposed therein and wherein said second set of teeth have a groove disposed therein, said electromagnetic interference shielding enclosure further comprising:

a first conductive gasket, said first conductive gasket disposed within said groove in said first set of teeth so as to provide a uniform electrical connection between said second housing and said first grounding strip; and a second conductive gasket, said second conductive gasket disposed within said groove in said second set of teeth so as to provide a uniform electrical connection between said first housing and said second grounding strip.

5. The electromagnetic interference shield of claim 1 wherein a thermally conductive dielectric pad is disposed over said integrated circuit device so as to conduct heat from said integrated circuit device to said second housing.

6. The electromagnetic interference shield of claim 1 wherein said heat conduction and dissipation system further comprises a plurality of extended surfaces extending from said second housing.

7. The electromagnetic interference shield of claim 1 further comprising:

an impingement fan disposed over said second housing for circulating air onto said second housing so as to conduct heat from said extended surfaces of said second housing.

8. An electromagnetic interference shielding enclosure with thermal conduction comprising:

a first housing formed of electrically conductive material, said first housing having a raised surface peripherally surrounding a first enclosure region;

an integrated circuit device having a top surface and a bottom surface, said integrated circuit device disposed over said first housing such that said integrated circuit device is disposed within said first enclosure region; and a second housing formed of thermally conductive and electrically conductive material, said second housing having a top surface and a bottom surface, said top surface having extended surfaces extending therefrom, said bottom surface having a raised surface extending therefrom peripherally surrounding a second enclosure region, said second housing disposed over said first housing such that said raised surface of said second housing overlies said raised surface of said first housing so as to form an enclosure therebetween, said raised surface of said second housing electrically coupled to said raised surface of said first housing so as to form an electrically conductive structure around said integrated circuit device such that, upon the operation of said integrated circuit device, radio frequency emissions from said integrated circuit device are shielded by said electrically conductive structure, said integrated circuit device thermally coupled to said second housing such that heat generated by said integrated circuit device is conducted away from said integrated circuit device and is dissipated through said extended surfaces;

a circuit board electrically coupled to an external power supply and electrically coupled to external devices, said circuit board disposed within said enclosure and electrically coupled to said integrated circuit device such that power may be applied to said integrated circuit device through said circuit board and such that electrical signals may be coupled between said external devices and said integrated circuit device and wherein said circuit board has a top surface and a bottom surface, said top surface including a first conductive grounding strip, said bottom surface having a second conductive ground strip, said circuit board disposed between said second housing and said first housing such that said raised surface of said second housing contacts said first conductive grounding strip and said raised surface of said first housing contacts said second conductive grounding strip so as to electrically connect said second housing and said first housing to an electrical ground.

9. The electromagnetic interference shielding enclosure of claim 8 wherein said integrated circuit device comprises a microprocessor, said electromagnetic interference shielding enclosure further comprising:

an interconnect socket disposed between said microprocessor and said circuit board, said interconnect socket including a plurality of interconnects for electrically coupling said microprocessor to said circuit board; and a compression coupling mechanism for attaching said second housing to said first housing such that pressure is applied to said microprocessor and applied to said circuit board such that said interconnects electrically couple said microprocessor to said circuit board.

10. The electromagnetic interference shielding enclosure of claim 8 wherein said compression coupling mechanism further comprises:

plurality of posts extending from said first housing, said plurality of posts extending through openings in said circuit board and openings in said second housing;

a plurality of springs disposed over said posts such that said springs contact said second housing; and a plurality of screws disposed within said posts, said screws having heads which contact said springs such that, upon the full engagement of said screws within said posts, said screws compress said springs such that said springs exert a relatively constant force between said second housing and said first housing so as to press said microprocessor and said compression coupling against said circuit board.

11. The electromagnetic interference shielding enclosure of claim 8 further comprising:

an impingement fan disposed over said second housing for circulating air onto said second housing so as to conduct heat from said extended surfaces of said second housing.

12. The electromagnetic interference shielding enclosure of claim 9 further comprising:

a second microprocessor coupled to said circuit board, said second microprocessor thermally coupled to said second housing such that heat from said second microprocessor is conducted away from said second microprocessor through said extended surfaces.

13. An electromagnetic interference shield with thermal conduction comprising:

a first housing formed of electrically conductive material, said first housing connected to an electrical ground;

a second housing disposed over said first housing so as to form an enclosure therebetween, said second housing formed of thermally conductive and electrically conductive material and connected to an electrical ground, said second housing having a heat conduction and dissipation system thermally coupled thereto;

a circuit board disposed between said first housing and said second housing, wherein said circuit board has a top surface and a bottom surface, said top surface including a first conductive grounding strip, said bottom surface having a second conductive grounding strip, said circuit board disposed between said second housing and said first housing such that said second housing contacts said first conductive grounding strip and said first housing contacts said second conductive grounding strip so as to electrically connect said second housing and said first housing to an electrical ground;

an integrated circuit device disposed within said enclosure and thermally coupled to said second housing such that heat generated by said integrated circuit device is conducted away from said integrated circuit device and is dissipated through said heat conduction and dissipation system, said second housing and said first housing absorbing emissions from said integrated circuit device so as to form an electromagnetic interference shield around said integrated circuit device;

an interconnect socket disposed between said integrated circuit device and said circuit board, said interconnect socket including a plurality of interconnects for electrically coupling said integrated circuit device to said circuit board; and a compression coupling mechanism for attaching said second housing to said first housing such that pressure is applied between said second housing and said first housing so as to press said integrated circuit device and said interconnect socket against said circuit board so as to electrically couple said integrated circuit device to said circuit board.

14. The electromagnetic interference shielding enclosure of claim 13 wherein said coupling mechanism further comprises:

a post extending from said first housing;

a spring disposed over said post; and a screw having a screw head disposed over said spring such that said screw head contains said spring above said second housing such that said spring exerts a force pressing said second housing toward said first housing so as to apply a uniform amount of pressure to said microprocessor so as to electrically couple said microprocessor to said circuit board.

\* \* \* \* \*